(12) United States Patent
Basker et al.

(10) Patent No.: US 9,177,810 B2
(45) Date of Patent: Nov. 3, 2015

(54) DUAL SILICIDE REGIONS AND METHOD FOR FORMING THE SAME

(71) Applicant: INTERNATIONAL BUSINESS MACHINES CORPORATION, Armonk, NY (US)

(72) Inventors: Veeraraghavan S. Basker, Schenectady, NY (US); Zuoguang Liu, Schenectady, NY (US); Tenko Yamashita, Schenectady, NY (US); Chun-Chen Yeh, Clifton Park, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 19 days.

(21) Appl. No.: 14/166,976

(22) Filed: Jan. 29, 2014

(65) Prior Publication Data
US 2015/0214058 A1     Jul. 30, 2015

(51) Int. Cl.
*H01L 21/31*     (2006.01)
*H01L 21/469*    (2006.01)
*H01L 21/283*    (2006.01)
*H01L 29/45*     (2006.01)
*H01L 21/02*     (2006.01)

(52) U.S. Cl.
CPC ........ *H01L 21/283* (2013.01); *H01L 21/02664* (2013.01); *H01L 29/456* (2013.01)

(58) Field of Classification Search
CPC . H01L 21/31; H01L 21/469; H01L 21/31604; H01L 21/28194; H01L 21/31403; H01L 29/571
USPC ........................... 438/253, 785; 257/306, 379
See application file for complete search history.

(56) References Cited

U.S. PATENT DOCUMENTS

| | | | |
|---|---|---|---|
| 7,112,483 B2 | 9/2006 | Lin et al. | |
| 7,189,648 B2 | 3/2007 | Lander et al. | |
| 7,799,682 B2 | 9/2010 | Beyer et al. | |
| 7,838,359 B2 | 11/2010 | Schwan et al. | |
| 8,288,828 B2 | 10/2012 | Iwatake et al. | |
| 8,324,043 B2 | 12/2012 | Kim et al. | |
| 8,450,216 B2 | 5/2013 | Teo et al. | |
| 2005/0208762 A1 | 9/2005 | Chen et al. | |
| 2008/0296696 A1 | 12/2008 | Yun et al. | |
| 2010/0052063 A1* | 3/2010 | Masuoka et al. | 257/369 |
| 2010/0230753 A1* | 9/2010 | Johnson et al. | 257/347 |
| 2013/0049128 A1 | 2/2013 | Scheiper et al. | |

FOREIGN PATENT DOCUMENTS

WO    WO2006081012 A1    8/2006

OTHER PUBLICATIONS

Zollner, S., et al. "Dual Silicide SOI CMOS Integration With Low-Resistance PTSI PMOS Contacts" 2007 IEEE International SOI Conference Proceedings. Oct. 2007. pp. 75-76.

* cited by examiner

*Primary Examiner* — Phuc Dang
(74) *Attorney, Agent, or Firm* — Tutunjian & Bitetto, P.C.; Vazken Alexanian

(57) ABSTRACT

A method for forming dual silicide regions includes forming semiconductor regions having a first thickness and a second thickness different from the first thickness and forming a dielectric layer over the semiconductor regions. Holes are opened up in the dielectric layer down to a first depth corresponding with the first or second thickness leaving a thickness of the dielectric layer over the other of the first or second thickness. A first silicide is formed at the first depth in the holes using a first deposited material. The holes are extended through the thickness of the dielectric layer to reach a second depth. A second silicide is formed at the second depth in the holes using a different material than the first deposited material.

20 Claims, 9 Drawing Sheets

DUAL SILICIDE REGIONS AND METHOD FOR FORMING THE SAME

BACKGROUND

1. Technical Field

The present invention relates to semiconductor devices, and more particularly to complementary metal oxide semiconductor devices having different silicide region materials depending on device dopant conductivity and employed in a single integration process.

2. Description of the Related Art

Silicides are often formed between contact metals and semiconductor materials, for example, for sources and drains of integrated circuit transistors. In many instances, complementary metal oxide semiconductor (CMOS) devices are employed in semiconductor devices and are processed side-by-side using the same materials and process parameters. Oftentimes, the process parameters and materials have different effects on performance between p-type field effect transistors (pFETs) versus n-type FETs (nFETs). For example, Ti silicide seems to improve nFET contact resistance due to its better thermal stability; however, Ti silicide degrades pFET contact resistance due to the contact interface resistivity as compared to other materials, like, NiSi.

SUMMARY

A method for forming dual silicide regions includes forming semiconductor regions having a first thickness and a second thickness different from the first thickness and forming a dielectric layer over the semiconductor regions. Holes are opened up in the dielectric layer down to a first depth corresponding with the first or second thickness leaving a thickness of the dielectric layer over the other of the first or second thickness. A first silicide is formed at the first depth in the holes using a first deposited material. The holes are extended through the thickness of the dielectric layer to reach a second depth. A second silicide is formed at the second depth in the holes using a different material than the first deposited material.

A method for forming dual silicide regions includes forming semiconductor regions with a plurality of thicknesses; forming a dielectric layer over the semiconductor regions; opening up holes in the dielectric layer down to a first depth corresponding with a largest thickness semiconductor region, the first depth leaving a thickness of the dielectric layer over semiconductor regions other than the largest thickness semiconductor region; depositing a first material in the holes; annealing to cause the first material to form a silicide with the largest thickness semiconductor region; extending the holes to reach the semiconductor regions other than the largest thickness semiconductor region; depositing a second material in the holes; and annealing to cause the second material to form a silicide with at least some of the semiconductor regions other than the largest thickness semiconductor region.

A dual silicide device includes semiconductor regions having a first thickness and a second thickness different from the first thickness. A dielectric layer is formed over the semiconductor regions having trenches therein. A first silicide region is formed at a first depth in the trenches corresponding with a location of one of the first or second thickness. A second silicide is formed at a second depth in the trenches corresponding with a location of the other of the first or second thickness using a different silicide material than the first silicide. Conductive materials are formed in the openings.

These and other features and advantages will become apparent from the following detailed description of illustrative embodiments thereof, which is to be read in connection with the accompanying drawings.

BRIEF DESCRIPTION OF DRAWINGS

The disclosure will provide details in the following description of preferred embodiments with reference to the following figures wherein.

DETAILED DESCRIPTION OF PREFERRED EMBODIMENTS

Figure 1:
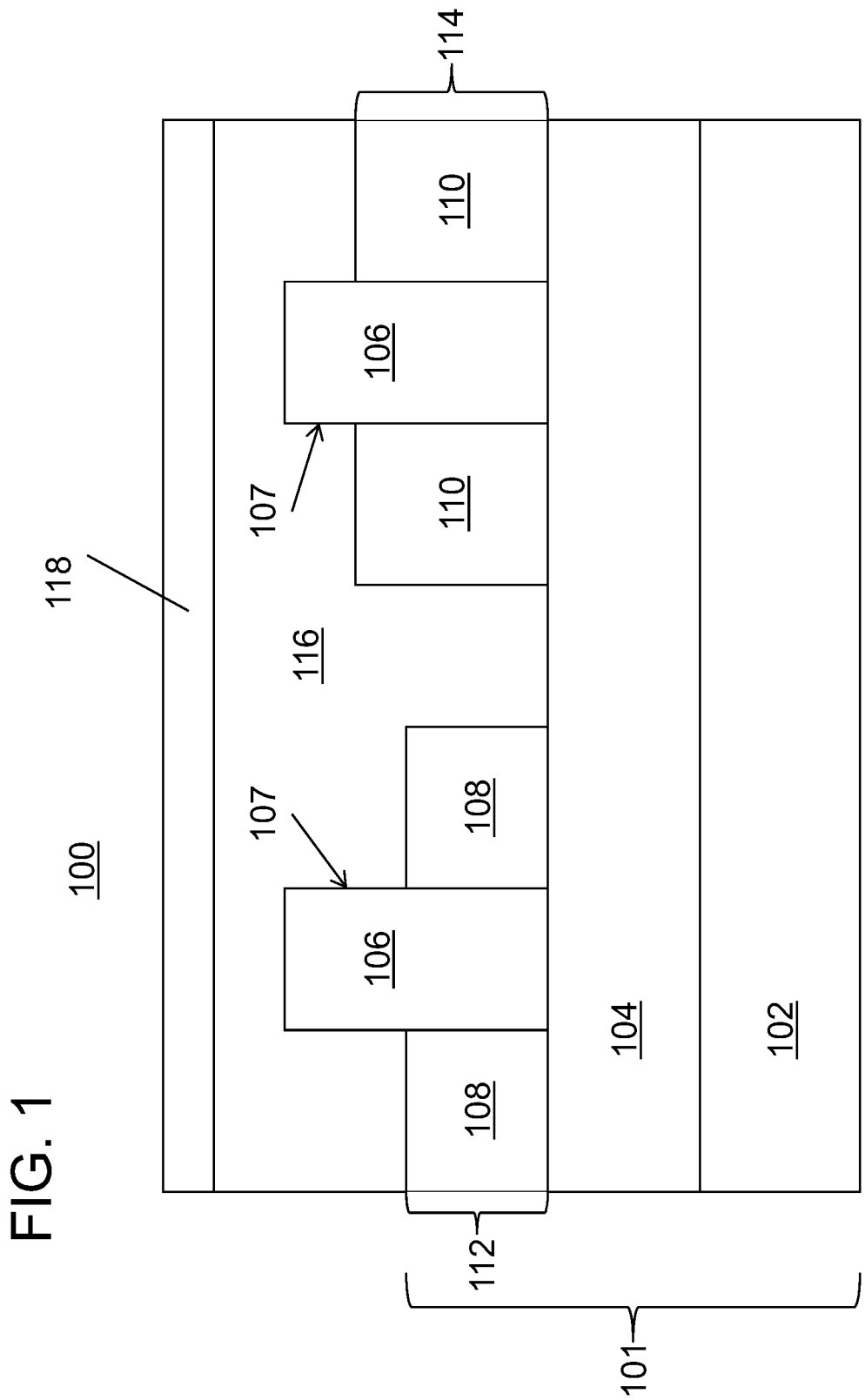
FIG. 1 is a cross-sectional view of a semiconductor device showing semiconductor regions of different heights/thicknesses in accordance with the present principles.

In accordance with the present principles, devices and integration methods are provided, which employ different materials for creating silicided junctions on different semiconductor structures. In one particularly useful embodiment, semiconductor materials are formed at different heights across a substrate or chip. A dielectric layer or layers are formed over the semiconductor material and openings are formed through the dielectric layer down to a first height. The holes do not extend down to the lower heights so that dielectric material of the dielectric layer remains between the hole or opening and the underlying semiconductor material during siliciding of semiconductor materials at the first height. Next, the dielectric material of the dielectric layer is opened up to expose semiconductor materials at the lower heights so that siliciding can be performed on semiconductor material at the lower heights.

The present principles will be described in terms of siliciding; however, other materials may be employed which include metal-semiconductor material mixtures for improving conductivity and interfacial properties. It is to be understood that the present invention will be described in terms of a given illustrative architecture having a wafer or substrate employed in semiconductor processing; however, other architectures, structures, substrate materials and process features and steps may be varied within the scope of the present invention. Illustrative embodiments herein describe the structure in terms of replacement metal gate (RMG) fin field effect transistor (finFET) structures and devices. However, other device structures and device types are also contemplated, e.g., planar transistors, vertical transistors, thin film transistors, etc. Furthermore, the present principles are particularly useful with complementary metal oxide semiconductor (CMOS) structures; however, different classes or types of devices may be employed instead of or in addition to CMOS devices.

It will also be understood that when an element such as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

A design for an integrated circuit chip in accordance with the present principles may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This may be extended, as readily apparent by one of ordinary skill in this and related arts, for as many items listed.

Referring now to the drawings in which like numerals represent the same or similar elements and initially to FIG. 1, a partially fabricated semiconductor device 100 is shown in cross-section to demonstrate the present principles. The device 100 includes a fin field effect transistor (finFET) structure, which is illustratively formed using a semiconductor-on-insulator (SOI) substrate 101. The SOI substrate 101 includes a bulk material or base substrate 102 having a buried dielectric layer 104 and a semiconductor layer 106 thereon. While a SOI substrate 101 is described, the present principles may be employed using a bulk substrate or other substrate(s) as needed.

The base substrate 102 may include any suitable material, e.g., Si, Ge, SiC, SiGe, GaAs, ceramic materials, glass, quartz, etc. The buried dielectric 104 may include a buried oxide or any other suitable dielectric material. The buried dielectric layer 104 may include a silicon oxide, a silicon nitride, a silicate glass, an organic dielectric, etc. The semiconductor layer 106 preferably includes a monocrystalline semiconductor material, e.g., Si although other materials may be employed, e.g., SiGe, Ge, etc.

In accordance with one embodiment, the semiconductor layer 106 is patterned to form fins 107. A known replacement metal gate (RMG) process may be employed to process and form the fins 107 for device 100. Other processes may also be employed.

In particularly useful embodiments, after the fins 107 have been patterned, e.g., using a sidewall image transfer (SIT) process or the like, any patterning masks are removed and the fins 107 are cleaned (e.g., using an etch process, e.g., an HF etch) to prepare surfaces for epitaxial material growth. In one embodiment, adjacent fins 107 will be employed to form an nFET device and a pFET device. In one embodiment, epitaxially grown semiconductor material 108 and epitaxially grown semiconductor material 110 are grown to different thicknesses, thicknesses 112 and 114, respectively. For example, epitaxially grown semiconductor material 108 may include n-type doped epitaxially grown materials (n-epi), and epitaxially grown semiconductor material 110 may include p-type doped epitaxially grown materials (p-epi). In one embodiment, the epitaxially grown semiconductor material 110 (p-epi) is intentionally grown thicker than the epitaxially grown semiconductor material 108 (n-epi).

The epitaxially grown materials 108 and 110 may be formed in different growth processes and may be doped in-situ. The thicknesses 112 and 114 may include a difference of a few nanometers to a few hundred nanometers apart, although greater thickness differences may be employed depending on the structure and application. It should be understood that the structures may include planar transistors or other structures and the height differences between the semiconductor materials may be achieved by different growth processes and/or etch processes.

In particularly useful embodiments, the semiconductor materials 108 and 110 include SiGe and the fins 107 include Si. It should be understood that other materials or material combinations may also be employed. Although two different heights 112 and 114 are illustratively depicted, it should also be understood that the device 100 may include a plurality of different heights (e.g., more than two) for the semiconductor materials. Each height may be processes the same or differently as needed.

A field dielectric 116, such as a field oxide (FOX) or other dielectric material, is formed over the fins 107 and the semiconductor materials 108 and 110. The field oxide 116 may include silicon oxide, although other materials may be employed. The field oxide 116 is preferably formed using a deposition process, e.g., a chemical vapor deposition (CVD) process, etc. A cap layer 118 may be formed over the field oxide 116 and preferably includes a dielectric material that has an etch selectivity that permits selective etching relative to the field oxide 116. For example, cap layer 118 may include a SiN material.

Figure 2:
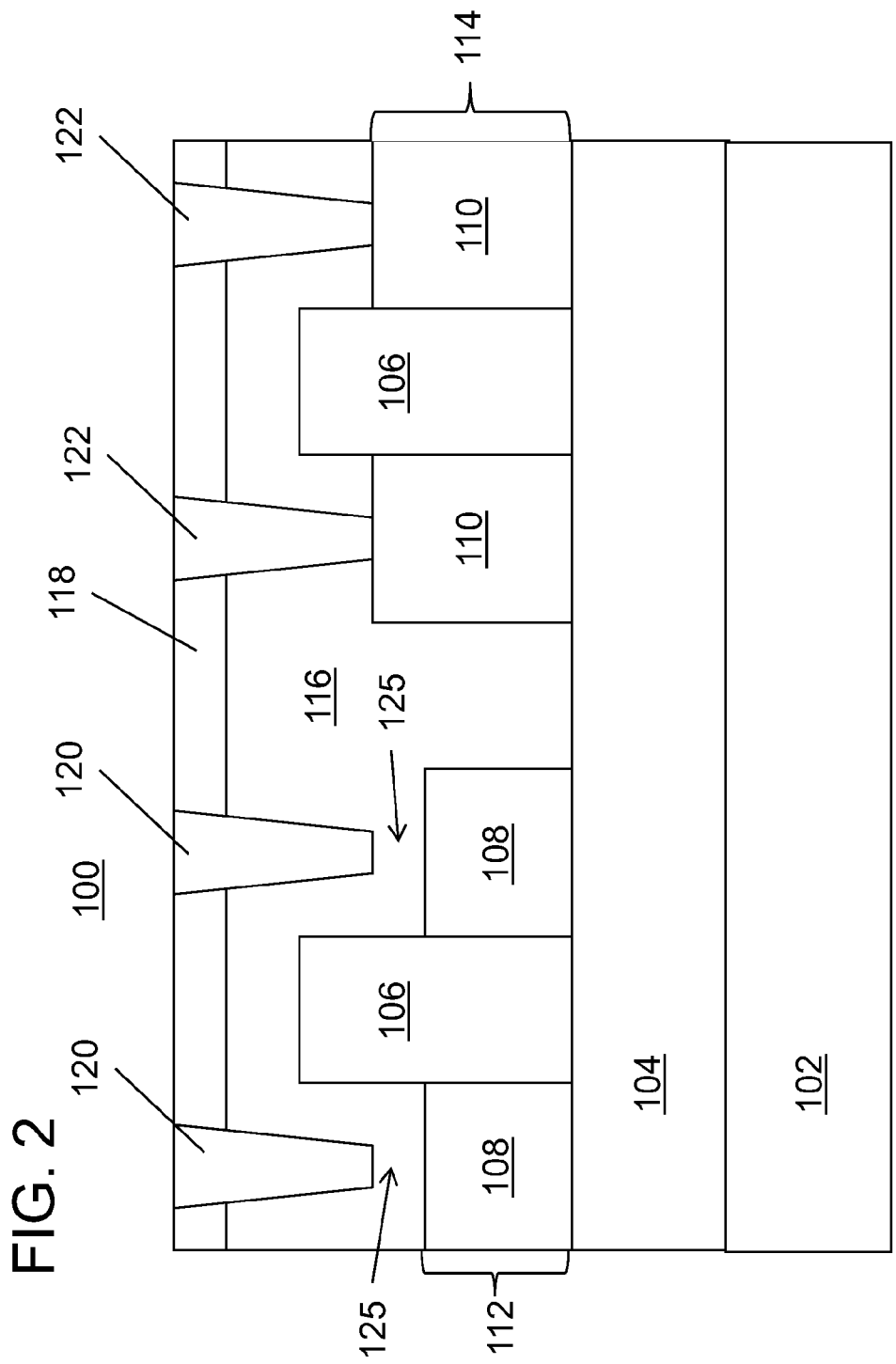
FIG. 2 is a cross-sectional view of the semiconductor device of FIG. 1 showing the formation of openings or via holes in a dielectric layer down to a first depth in accordance with the present principles.

Referring to FIG. 2, an anisotropic etching process is performed to form contact holes, trenches or openings 120, 122 down a highest level 114. In one embodiment, the anisotropic etch may include a reactive ion etch (RIE). In one embodiment, a photoresist or other mask (not shown) is formed over the cap layer 118 and developed to open up holes where contacts or other interlevel conductive connections are to be made. In one embodiment, the RIE stops on top of semiconductor materials 110 (e.g., p-epi) to form holes 122. The RIE also stops over the semiconductor materials 108 leaving a portion 125 of dielectric layer 116 over the semiconductor materials 108 and forming holes 120. In one embodiment, the semiconductor materials 108 (n-epi) are employed for nFETs, and the semiconductor materials 110 (p-epi) are employed for pFETs.

Figure 3:
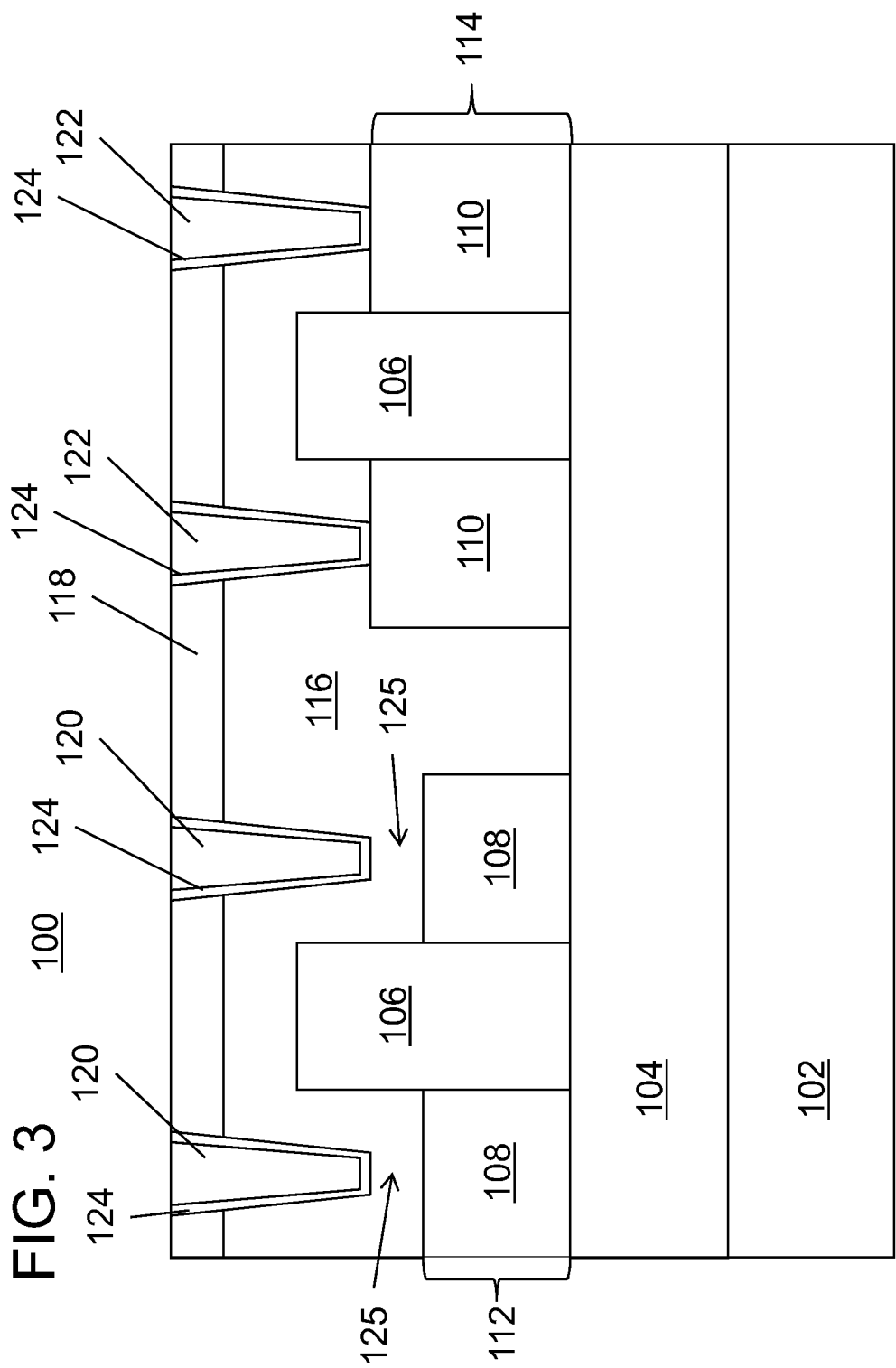
FIG. 3 is a cross-sectional view of the semiconductor device of FIG. 2 showing a material deposited in the openings of the dielectric layer in accordance with the present principles.

Referring to FIG. 3, the openings 120 and 122 are lined or filled with a material 124. The material 124 includes a compound or element selected to intermix with the semiconductor material 110, which is exposed at the bottom of holes 122. The material 124 may include a metal, such as Ni, Pt, Co, etc. or an alloy or alloys thereof, e.g., NiPt. The material 124 may be deposited using a CVD process, sputtering, plating or other deposition process. A thickness of the material 124 may vary depending on the application, but may be between about 1 nm to about 15 nm. The deposition process is preferably followed by a chemical mechanical polishing (CMP) step to remove the material 124 from an upper surface of the cap layer 118.

The material 124 is preferably selected to be compatible with and beneficial for creating a silicide with semiconductor material 110. The semiconductor material 110 may include p-type materials for pFET device formation. The portion 125 of the dielectric layer 116 between holes 120 and semiconductor material 108 prevents interaction between the material 124 and the semiconductor material 108.

Figure 4:
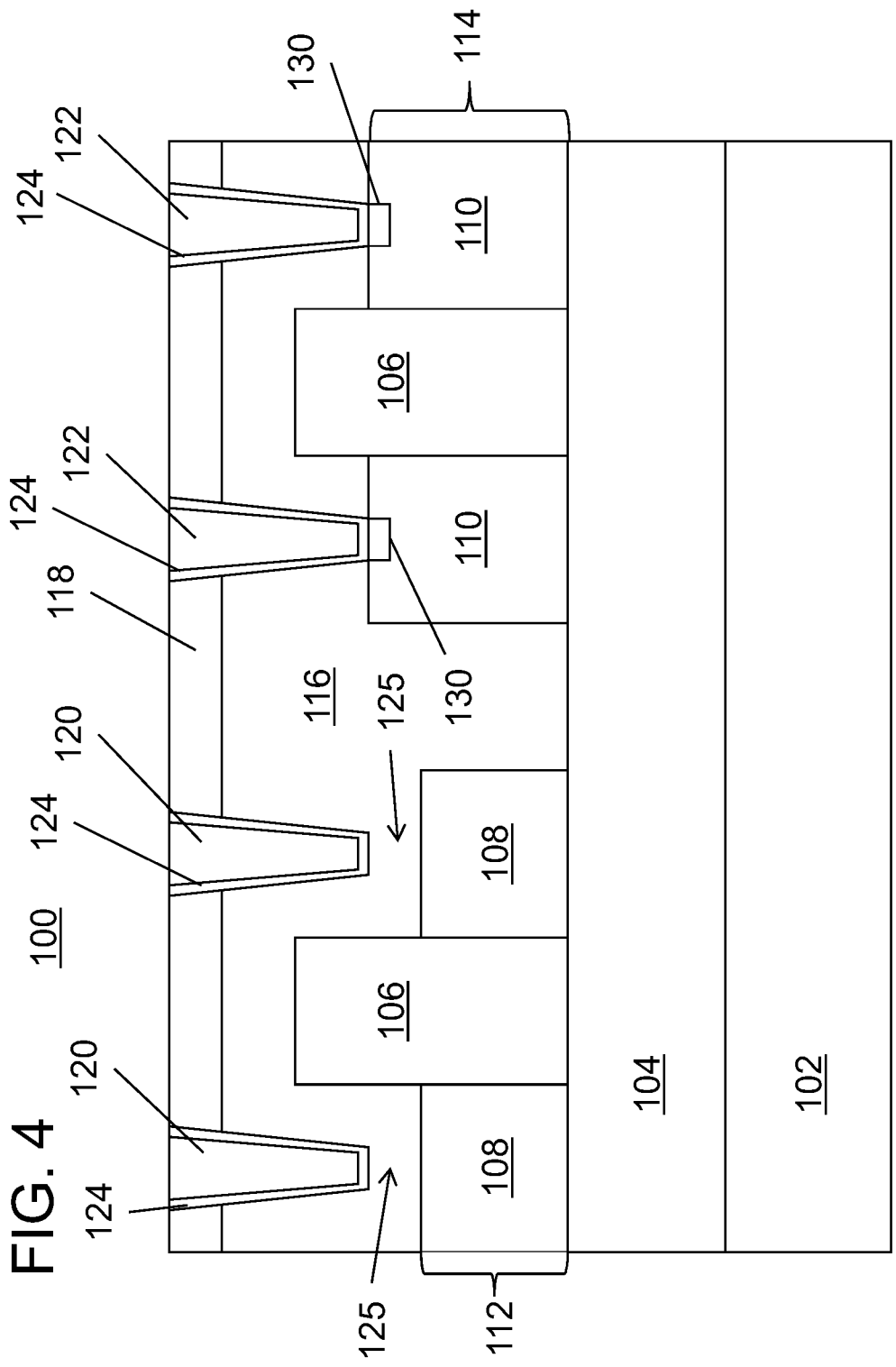
FIG. 4 is a cross-sectional view of the semiconductor device of FIG. 3 showing first silicide regions formed in semiconductor regions at a first depth through the openings of the dielectric layer in accordance with the present principles.

Referring to FIG. 4, the device 100 is annealed to cause material 124 to diffuse into the semiconductor material 110 to form intermixed regions 130 (silicide regions). In one embodiment, the p-epi of semiconductor material 110 includes Si and the material 124 includes Ni—Pt, and the intermixed regions 130 include NiSi to form NiSi contacts on the pFET side of device 100. The annealing process may include any conventional annealing process, such as a rapid thermal anneal or the like. NiSi is formed only inside the semiconductor material 110 (p-epi) for the pFET.

Figure 5:
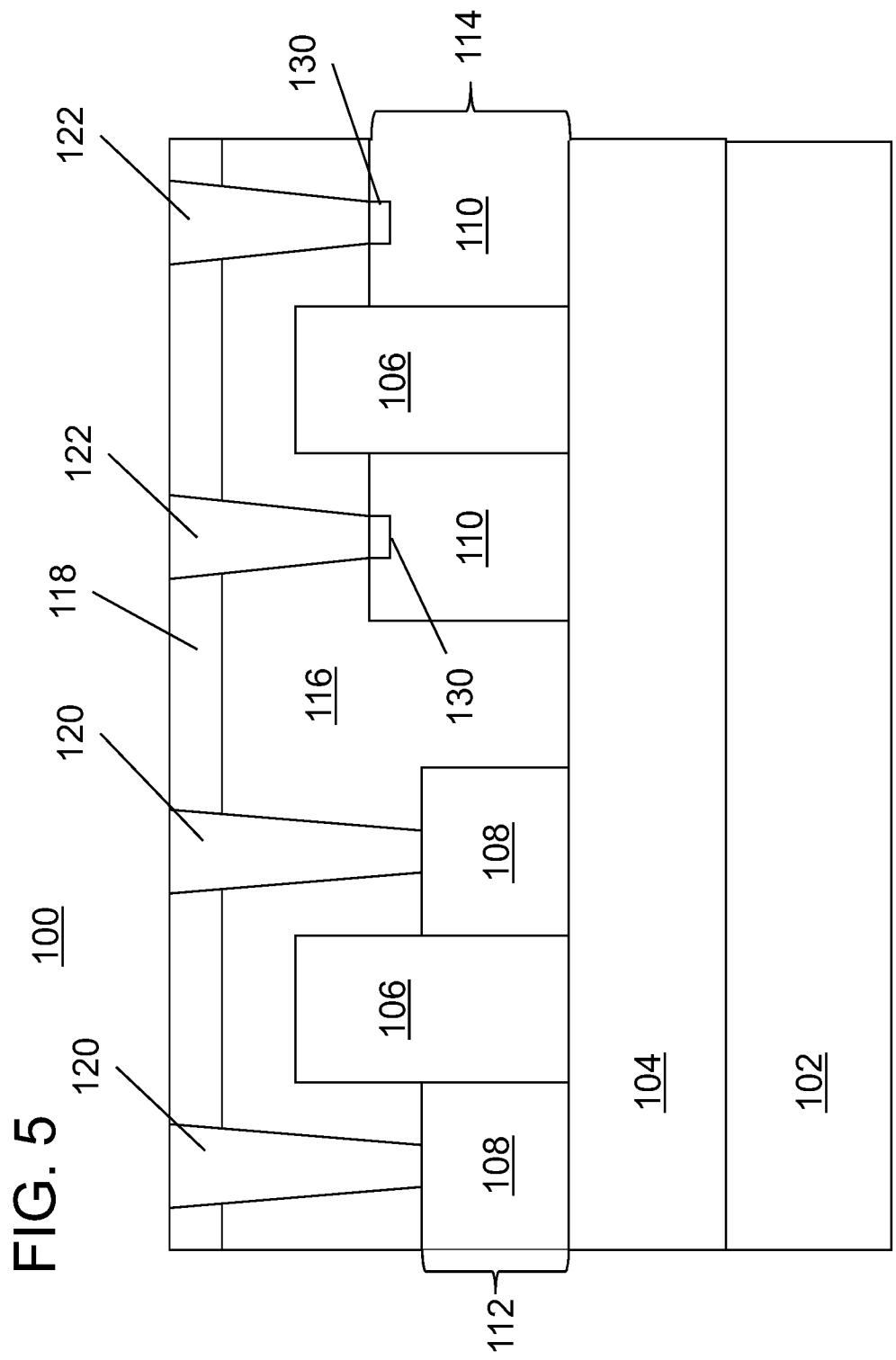
FIG. 5 is a cross-sectional view of the semiconductor device of FIG. 4 showing the openings extended to semiconductor regions at a second depth in accordance with the present principles.

Referring to FIG. 5, the remaining portions of the material 124 is stripped off using an etching process (e.g., a wet etch, a dry etch, etc.). The process for stripping off the materials 124 exposes the dielectric layer 116 in the openings (trenches) 120 and 122. Next, another RIE or similar etch process is performed to extend holes or trenches 120 down to semiconductor material 108 (e.g., to the top of n-epi 108 on the nFET side of the device 100). On the pFET side, the RIE is stopped on top of the intermixed regions 130 (e.g., NiSi). The silicided material 130 functions as an etch stop.

Figure 6:
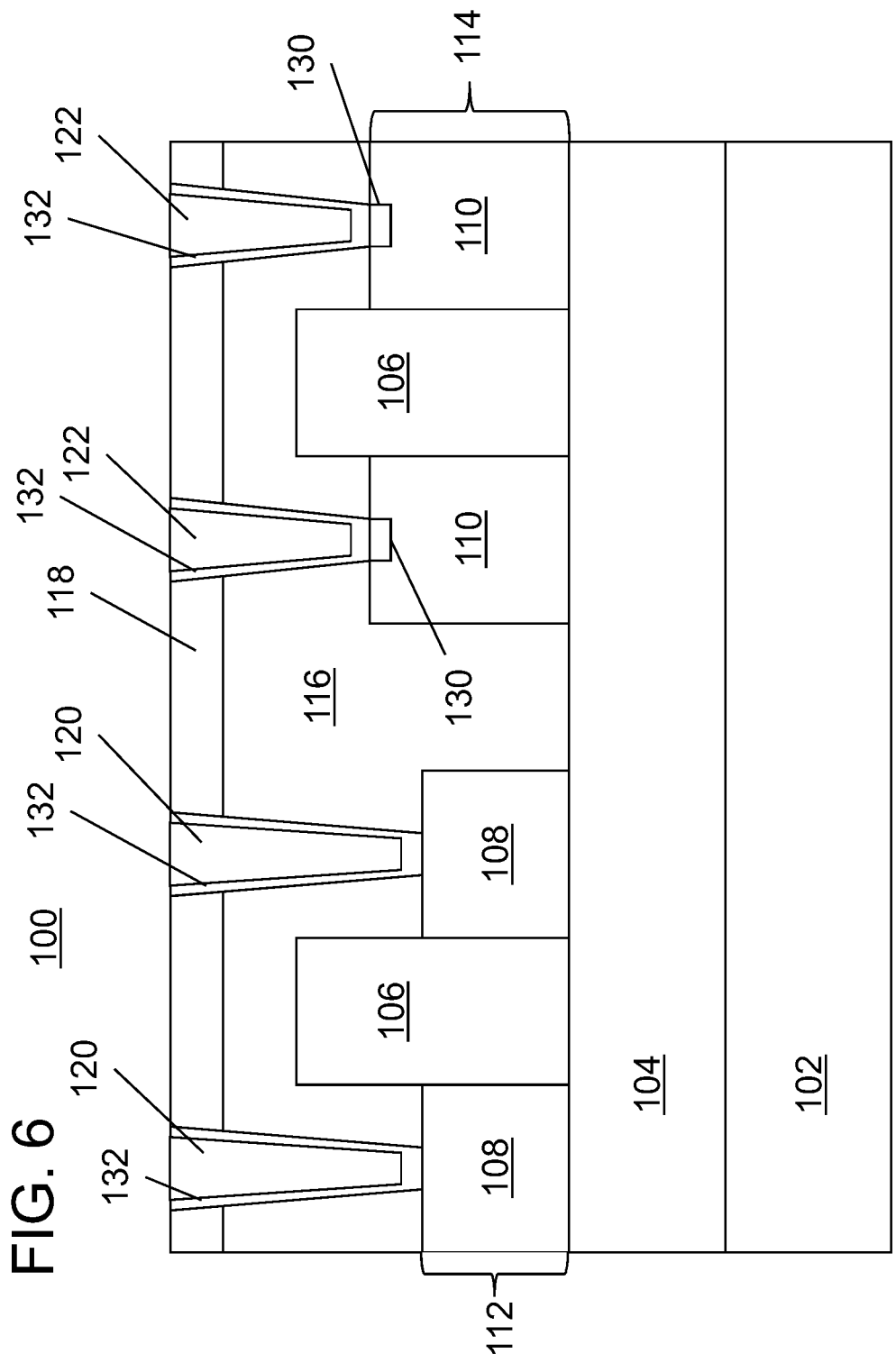
FIG. 6 is a cross-sectional view of the semiconductor device of FIG. 5 showing the openings lined with another siliciding material in accordance with the present principles.

Referring to FIG. 6, the openings 120 and 122 are lined or filled with a material 132. The material 132 includes a compound or element selected to intermix with the semiconductor material 108, which is exposed at the bottom of holes 120. The material 132 is also formed in contact with regions 130; however, regions 130 are saturated and may not intermix further with material 132. The material 132 may include a metal, such as Ti or an alloy thereof. The material 132 may be deposited using a CVD process, sputtering, plating or other deposition process. A thickness of the material 132 may vary depending on the application, but may be between about 1 nm to about 15 nm. The deposition process is preferably followed by a chemical mechanical polishing (CMP) step to remove the material 132 from an upper surface of the cap layer 118.

The material 132 is preferably selected to be compatible with and beneficial for creating a silicide with semiconductor material 108. The semiconductor material 108 may include n-type materials for nFET device formation. The previous formation of the intermixed regions limits further interaction between the material 132 and the semiconductor material 110.

Figure 7:
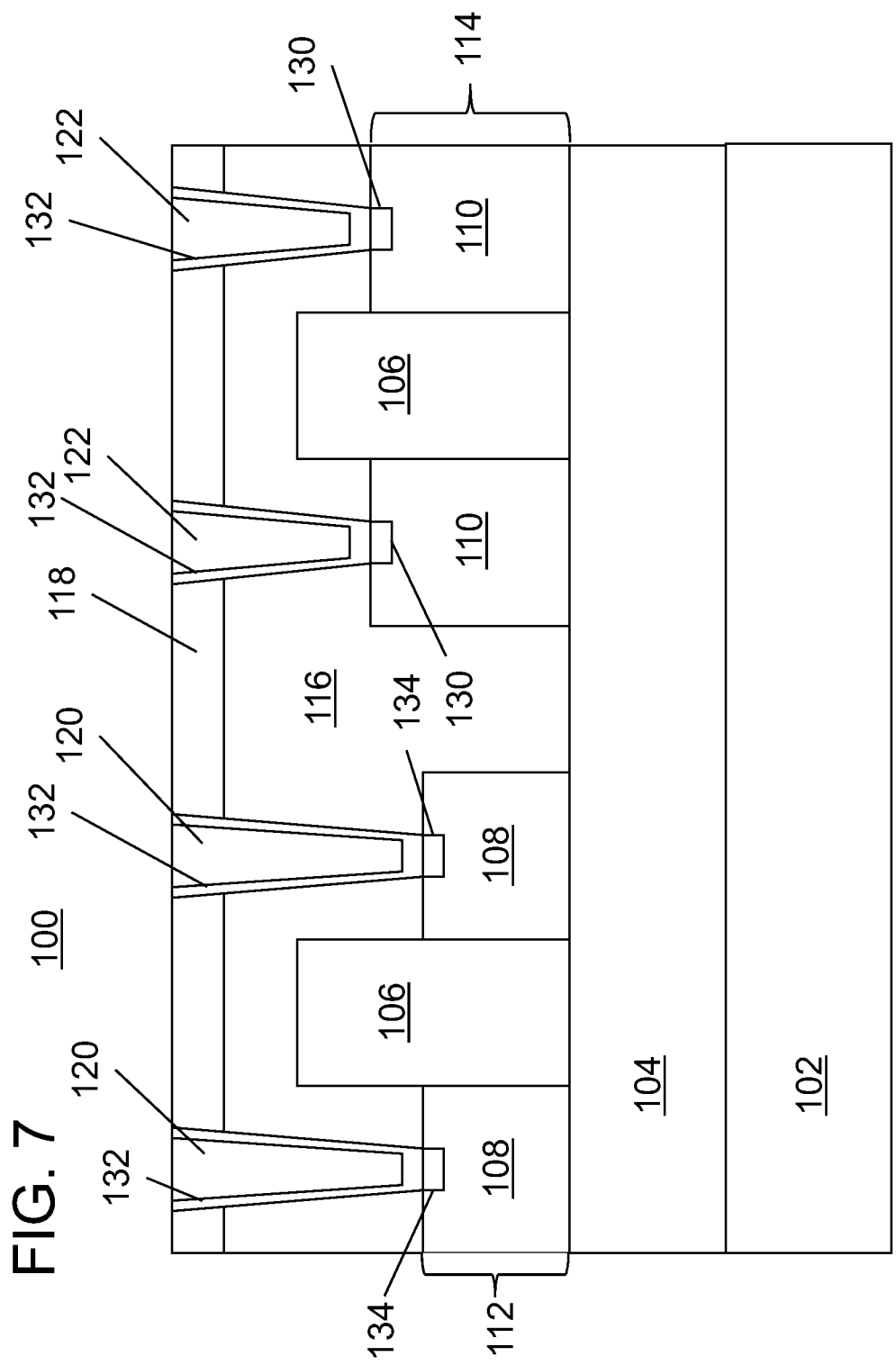
FIG. 7 is a cross-sectional view of the semiconductor device of FIG. 6 showing second silicide regions formed in semiconductor regions at the second depth in accordance with the present principles.

Referring to FIG. 7, the device 100 is annealed to cause material 132 to diffuse into the semiconductor material 108 to form intermixed regions 134 (silicide regions). In one embodiment, the n-epi of semiconductor material 108 includes Si and the material 132 includes Ti, and the intermixed regions 134 include TiSi to form TiSi contacts on the nFET side of device 100. The annealing process may include any conventional annealing process, such as a rapid thermal anneal or the like. TiSi is formed only inside the semiconductor material 108 (n-epi) of the nFET. Ti silicides have a tendency to degrade pFET contact resistance due to a high contact resistivity (e.g., compared with, e.g., NiSi). TiSi, however, seems to improve nFET contact resistance due to its better thermal stability.

In accordance with the present principles, different siliciding materials (e.g., Ni, Ti, Co, W, Pt, Pd, etc.) may be employed in a same process flow. By forming semiconductor materials on different levels (heights) the same contact holes may be employed to provide two or more different siliciding materials at different times. During processing of one silicide material, semiconductor material is protected (e.g., by a portion of a dielectric layer), and during the processing of a second silicide material, the semiconductor material is already saturated to prevent the intermixing of the second silicide material. It should be understood that in other embodiments, the nFET side (formed to a greater height) may be silicided first followed by the pFET silicide (formed to a lower height).

Figure 8:
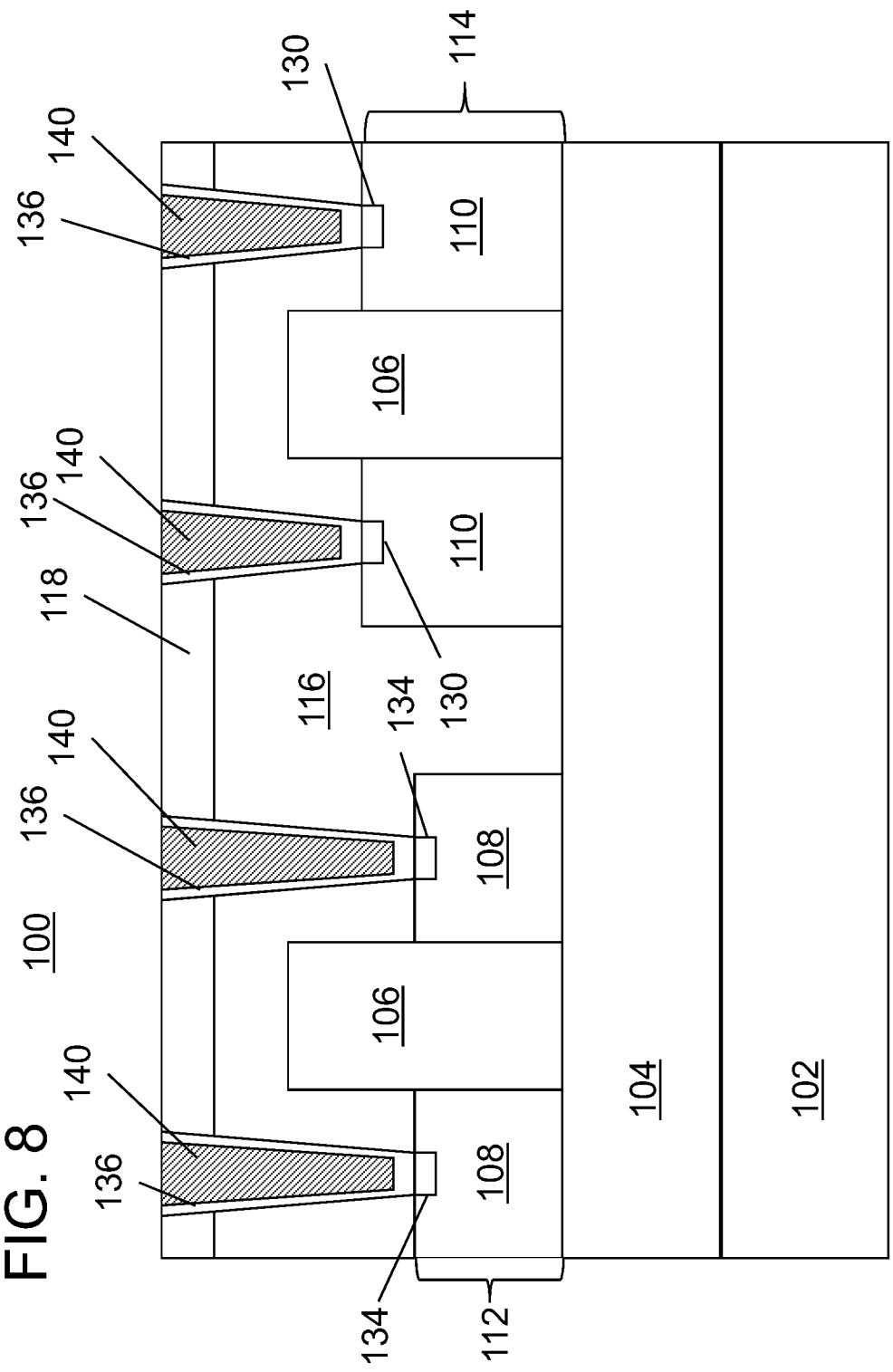
FIG. 8 is a cross-sectional view of the semiconductor device of FIG. 7 showing a conductive liner and conductor material (contacts) formed to contact the semiconductor regions in accordance with the present principles.

Referring to FIG. 8, the remaining portions of the material 132 are stripped off using an etching process (e.g., a wet etch, a dry etch, etc.). The process for stripping off the materials 132 exposes the dielectric layer 116 in the openings (trenches) 120 and 122. In one useful embodiment, the openings 120, 122 are lined with a diffusion barrier 136 and then filled with a conductive material 140. The barrier 136 may include TiN, TaN, or other useful materials. The conductive material 140 may include a metal, (e.g., W, Cu, Al, Ag, etc.), doped polysilicon, or any other useful conductive material. Processing can continue by further forming metallization and dielectric layers in accordance with a given application or applications.

Figure 9:
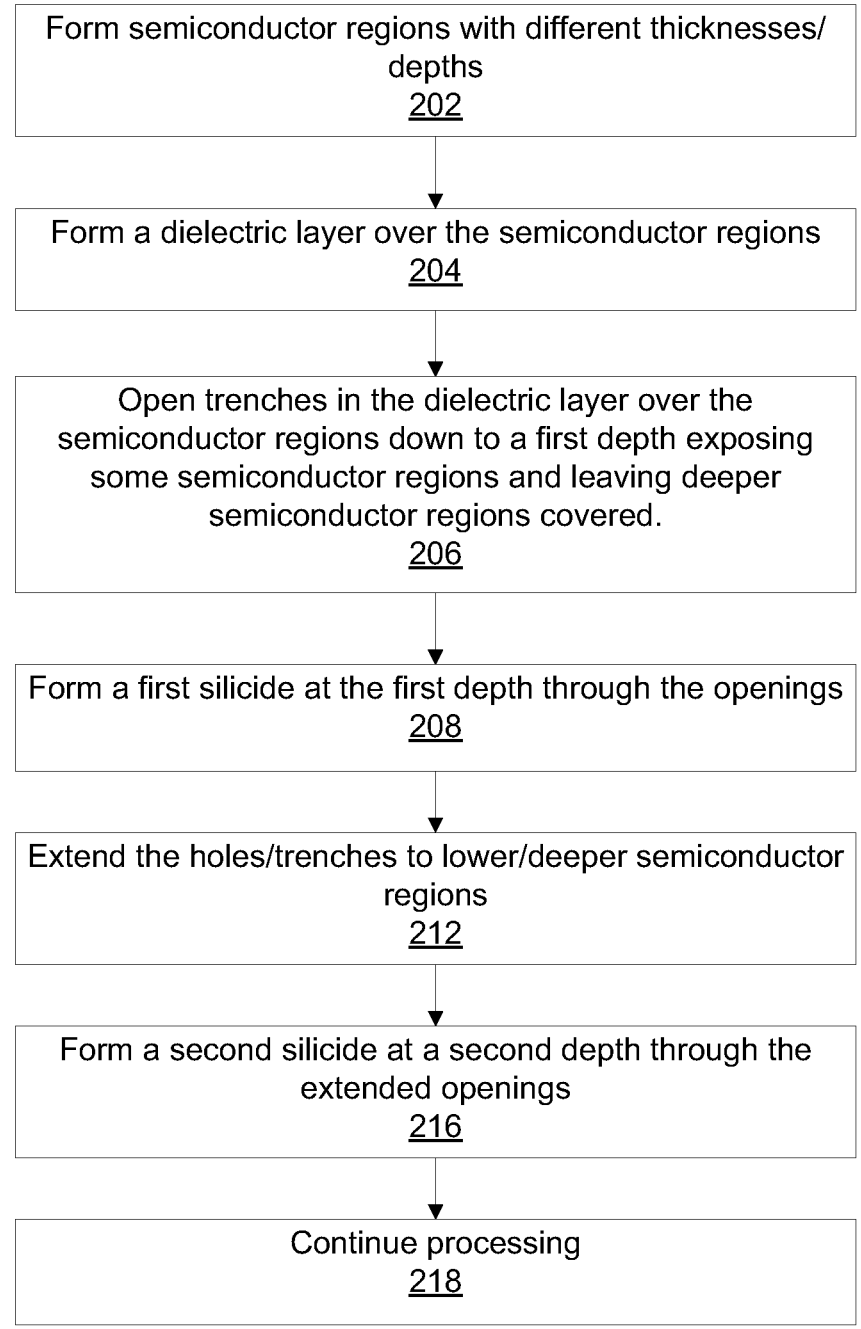
FIG. 9 is a block/flow diagram showing methods for forming a dual silicide device in a single integration process in accordance with illustrative embodiments.

Referring to FIG. 9, methods for forming dual silicide regions in a single integration process are shown in accordance with the present principles. It should also be noted that, in some alternative implementations, the functions noted in the blocks may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

In block 202, semiconductor regions are formed having a first thickness and a second thickness different from the first thickness. This may include growing epitaxial layers to different thicknesses, forming the semiconductor regions and then etching semiconductor materials to different thicknesses, etc. The semiconductor regions may include different dopant types as well as different heights, for example, n-type dopants may be employed in one of the first thickness or the second thickness, and p-type dopants may be employed with the other of the first thickness or the second thickness. In one embodiment, the semiconductor regions may be formed in contact with semiconductor fins. The semiconductor regions may include source and drain regions for different types of transistors or other electronic devices.

In block 204, a dielectric layer(s) is formed over the semiconductor regions. The dielectric layer may include a plurality of layers including a cap layer.

In block 206, holes, openings or trenches are opened up or otherwise formed in the dielectric layer down to a first depth corresponding with one of the first or second thickness leaving a thickness of the dielectric layer over the other of the first or second thickness. These regions remain covered and protected from a first siliciding process. The holes or trenches may be formed using lithographic formation of an etch mask or other patterning technique. In block 208, a first silicide is formed at the first depth in the holes using a first deposited material. In block 212, the holes are extended through the thickness of the dielectric layer to reach a second depth. This may include a reactive ion etch process where the reactants selectively etch the dielectric material but do not etch or etch at a significantly lower rate the exposed first silicide already formed in the openings.

In block 216, a second silicide is formed at the second depth in the holes using a different material than the first deposited material. Intermixing of a material for the second silicide is prevented in the first silicide. This may be implemented by laying down a barrier material or by saturating the first silicide with the first material to prevent a large amount of intermixing of the second material. The first silicide or the second silicide may include Ti for semiconductor regions with n-type dopants, and the other of the first material or the second material may include Ni, Co, etc. for the semiconductor regions with p-type dopants. In block 218, the processing continues to complete the device or devices.

Having described preferred embodiments for dual silicide integration (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method for forming dual silicide regions, comprising:
    forming semiconductor regions having a first thickness and a second thickness different from the first thickness;
    forming a dielectric layer over the semiconductor regions;
    opening up holes in the dielectric layer down to a first depth corresponding with one of the first or second thickness leaving a thickness of the dielectric layer over the other of the first or second thickness;
    forming a first silicide in the holes at the first depth using a first deposited material;
    extending the holes through the thickness of the dielectric layer to reach a second depth; and
    forming a second silicide at the second depth in the holes using a different material than the first deposited material.

2. The method as recited in claim 1, wherein forming semiconductor regions includes growing epitaxial layers to different thicknesses.

3. The method as recited in claim 1, wherein forming semiconductor regions includes etching semiconductor materials to different thicknesses.

4. The method as recited in claim 1, wherein forming semiconductor regions includes:
    forming the semiconductor regions with n-type dopants having one of the first thickness or the second thickness; and
    forming the semiconductor regions with p-type dopants having the other of the first thickness or the second thickness.

5. The method as recited in claim 1, wherein one of the first silicide or the second silicide includes Ti for semiconductor regions with n-type dopants.

6. The method as recited in claim 4, wherein forming semiconductor regions with a plurality of thicknesses includes forming the semiconductor regions in contact with semiconductor fins.

7. The method as recited in claim 1, wherein one of the first material or the second material includes Ni and Co for the semiconductor regions with p-type dopants.

8. The method as recited in claim 1, wherein extending the holes includes etching the holes selective to the first silicide.

9. The method as recited in claim 1, wherein forming a second silicide includes preventing intermixing of a material for the second silicide in the first silicide.

10. A method for forming dual silicide regions, comprising:
    forming semiconductor regions with a plurality of thicknesses;
    forming a dielectric layer over the semiconductor regions;
    opening up holes in the dielectric layer down to a first depth corresponding with a largest thickness semiconductor region, the first depth leaving a thickness of the dielectric layer over semiconductor regions other than the largest thickness semiconductor region;

depositing a first material in the holes;

annealing to cause the first material to form a silicide with the largest thickness semiconductor region;

extending the holes to reach the semiconductor regions other than the largest thickness semiconductor region;

depositing a second material in the holes; and annealing to cause the second material to form a silicide with at least some of the semiconductor regions other than the largest thickness semiconductor region.

11. The method as recited in claim 10, wherein forming semiconductor regions at a plurality of thicknesses includes growing epitaxial layers to different thicknesses.

12. The method as recited in claim 10, wherein forming semiconductor regions at a plurality of thicknesses includes etching semiconductor materials to different thicknesses.

13. The method as recited in claim 10, wherein forming semiconductor regions with a plurality of thicknesses includes:

forming semiconductor regions with n-type dopants having a first thickness;

forming semiconductor regions with p-type dopants having a second thickness.

14. The method as recited in claim 10, wherein one of the first material or the second material includes Ti for the semiconductor regions with n-type dopants.

15. The method as recited in claim 10, wherein forming semiconductor regions with a plurality of thicknesses includes forming semiconductor regions in contact with semiconductor fins.

16. The method as recited in claim 10, wherein one of the first material or the second material includes Ni and Co for semiconductor regions with p-type dopants.

17. The method as recited in claim 10, wherein extending the holes to reach the semiconductor regions other than the largest thickness semiconductor region includes etching the holes selective to the silicide with the largest thickness semiconductor region.

18. A dual silicide device, comprising:

semiconductor regions having a first thickness and a second thickness different from the first thickness;

a dielectric layer formed over the semiconductor regions having trenches therein;

a first silicide region formed at a first depth in the trenches corresponding with a location of one of the first or second thickness;

a second silicide formed at a second depth in the trenches corresponding with a location of the other of the first or second thickness using a different silicide material than the first silicide; and conductive materials formed in the openings.

19. The device as recited in claim 18, wherein the semiconductor regions include n-type dopant regions having one of the first thickness or the second thickness; and p-type dopants regions having the other of the first thickness or the second thickness.

20. The method as recited in claim 18, wherein one of the first silicide or the second silicide includes Ti for semiconductor regions with n-type dopants; and the other of the first material or the second material includes Ni and Co for the semiconductor regions with p-type dopants.

* * * * *